United States Patent [19]

Boatwright et al.

[11] Patent Number: 5,802,379
[45] Date of Patent: Sep. 1, 1998

[54] BATTERY DEPLETION MANAGEMENT IN PORTABLE COMPUTING DEVICES HAVING PCMCIA CARD LOADING

[75] Inventors: Darrell L. Boatwright; Rickey G. Austin, both of Cedar Rapids, Iowa

[73] Assignee: Norand Corporation, Cedar Rapids, Iowa

[21] Appl. No.: 701,439

[22] Filed: Aug. 23, 1996

Related U.S. Application Data

[60] Provisional application No. 60/002,729 Aug. 24, 1995.
[51] Int. Cl.$^6$ .................. G06F 1/26; G06F 1/32
[52] U.S. Cl. .................. 395/750.06; 395/750.05; 395/750.08
[58] Field of Search .......... 395/750.05, 750.06, 395/750.08; 364/483, 707; 320/43

[56] References Cited

U.S. PATENT DOCUMENTS

| | | | |
|---|---|---|---|
| 4,451,742 | 5/1984 | Aswell | 307/66 |
| 4,907,183 | 3/1990 | Tanaka | 395/750.08 |
| 5,230,056 | 7/1993 | Hoshina | 395/750.08 |
| 5,339,445 | 8/1994 | Gasztonyi | 395/750.06 |
| 5,442,794 | 8/1995 | Wisor et al. | 395/750.08 |
| 5,511,205 | 4/1996 | Kannan et al. | 395/750.06 |
| 5,546,589 | 8/1996 | Odaira | 395/750.08 |
| 5,560,024 | 9/1996 | Harper et al. | 395/750.04 |
| 5,600,229 | 2/1997 | Oh | 320/48 |

*Primary Examiner*—Gopal C. Ray
*Attorney, Agent, or Firm*—Akin, Gump, Strauss, Hauer & Feld, L.L.P.

[57] ABSTRACT

A battery powered device having a plurality of PCMCIA (or other) type slots uses monitoring circuitry to detect the onset of battery power depletion. In response to the onset detection, control circuitry attempts to selectively remove power from ones of the plurality of slots. With the battery load thus lessened, the battery powered device has a greater opportunity to execute emergency procedures such as alert the user and save operational data. A processing circuit selectively overrides the control circuit in the attempt to prevent the removal of power. The processing circuit may also enable a presently disabled slots at and for any time period after the detection of depletion onset. Further, the processing circuit selectively coordinates power down if need be based on the consideration of characteristics of certain installed cards. The processing circuit may also calculate and adjust (through power down) loading after onset detect based on estimates of remaining battery life.

13 Claims, 6 Drawing Sheets

BATTERY DEPLETION MANAGEMENT IN PORTABLE COMPUTING DEVICES HAVING PCMCIA CARD LOADING

CROSS REFERENCE TO RELATED APPLICATIONS

Claiming Priority Pursuant To 35 U.S.C. Sec. 119(e)

This application claims priority pursuant to 35 U.S.C. Sec. 119(e) to U.S. Provisional application Ser. No. 60/002,729 (Attorney Docket No. DN38200P1), filed on Aug. 24, 1995. Such provisional application is hereby incorporated herein by reference in its entirety.

BACKGROUND

1. Technical Field

The present invention relates generally to battery depletion management of I/O (input/output) and storage cards that are used with portable computing devices, and, more specifically, to the management of battery power delivered to PCMCIA (Personal Computer Memory Card Industry Association) compatible devices inserted within portable computing devices when the onset of battery power depletion is detected.

2. Description of Related Art

The use of PCMCIA compatible devices (hereinafter "PCMCIA cards") in portable computing devices is well known in the art. PCMCIA compatibility is currently specified for industry standardization in a PCMCIA Specification Release 2.0. Instead of limiting the PCMCIA standard to support only memory type cards, the standard continues to be expanded to support a much wider variety of PCMCIA card functionality. Thus, in addition to the many types of memory cards, conventional PCMCIA cards can be found which support various I/O functionality, including, for example, wireless transmitters, modems and networking cards.

The expanding PCMCIA standards and resulting multitude of PCMCIA card types have made it possible to more fully support user defined, adaptable configurations for small portable computing devices. However, a disadvantage of such configurability involves the inability to predict the impact such configurations might have on the performance of a given portable computing device (hereinafter a "host device"). Another disadvantage involves the inability to predict the impact such configurations might have on the performance of the inserted PCMCIA cards themselves.

PCMCIA cards are inserted into slots (hereinafter "PCMCIA card slots") found in most conventional portable computing devices. Upon insertion into a PCMCIA card slot, the PCMCIA card communicatively couples with the processing circuitry of the host device. The PCMCIA card also couples to draw power from the host device's power supply. Portable computing devices usually operate via battery power, and thus have a limited power resources. Because the battery usage and capacity varies from one portable computing device to the next and from one PCMCIA card configuration to the next, many portable computing device configurations frequently result in a sudden onset of battery depletion and complete failure. The suddenness of onset and subsequent battery failure often prevents conventional portable computing devices from having an opportunity to inform the user, so that battery failure can be avoided through supplementation, replacement or recharging. Moreover, the suddenness may also supersede a host device's attempt to save current data and processing conditions, causing potentially detrimental results.

In particular, conventional host devices are designed with "onset procedures" to avoid potentially detrimental results from battery failure. The onset procedures typically involve an attempt to warn the user of the onset to allow the user to save current information, end a session, and power down the device before such failure occurs. Thereafter, the batteries may be supplemented, replaced or recharged so that the host device may again be powered into an operational state. Other conventional host devices also permit the user to seek battery supplementation, replacement or recharging without first having to power down the host device. In either case, the user must be presented with enough advance warning to permit the carrying out of the onset procedures before complete battery failure occurs. However, because some PCMCIA cards sporadically place a relatively high load on the host device's battery resources, many host devices configured with such cards experience battery failure before ever having sufficient time to carry out the onset procedures.

For example, PCMCIA radio transceiver cards often place a heavy load on battery resources when transmitting. When placed in a conventional hand-held computer having rather limited battery resources, the PCMCIA radio transceiver card often causes battery failure before the onset procedures can be executed. As soon as onset is detected (often during a transmission event), the computer begins executing the onset procedures by attempting to warn the user. If transmissions continue or begin during such an attempt, the battery rapidly enters a depleted state, typically before the user has an opportunity to respond to the warning, losing data and operational status.

Because the PCMCIA cards are unaware of the onset of battery depletion, they freely begin and continue tasks that cannot be completed due to preemptive battery depletion. Therefore, such tasks only worsen the problem by accelerating the depletion process. Furthermore, some tasks that terminate abruptly can also prove detrimental, e.g., PCMCIA card data storage might be damaged or corrupted.

Thus, there is a need in the art for a means to prevent the unexpected loss of data and operational status in portable computing devices caused by accelerated battery depletion conditions imposed on such portable computing devices by various available PCMCIA cards and PCMCIA card combinations. There is also a need for a means to prevent PCMCIA cards from continuing or beginning operational tasks which at best merely accelerate battery depletion.

An object of the present invention is to solve the aforementioned problems. This and other objects of the present invention will become apparent from examination of the drawings and remainder of the specification which follows.

SUMMARY OF THE INVENTION

In accordance with one embodiment of the present invention, a battery powered device is disclosed which has one or more receptacles for receiving cards. The battery powered device comprises a monitoring circuit coupled to a power supply that generates an output signal indicative of an onset of a depletion of the battery power delivered by the power supply. A power control circuit of the battery powered device attempts to prevent the power supply from delivery battery power to the one or more receptacles in response to the generation of the output signal of the monitoring circuit. A processing circuit of the battery powered device receives battery power without interference from the power control circuit even after the generation of the output signal of the monitoring circuit. Moreover, the processing circuit selectively overrides the power control circuit in the attempt to prevent the power supply from delivering battery power to the one or more receptacles.

Further aspects of the battery powered device of the present invention may be found in several innovative extensions. For example, the processing circuit may be configured to attempt to alert a user in response to the generation of the output signal of the monitoring circuit. Also in response, the processing circuit may attempt to save operational information for later recovery.

The battery powered device may also comprise a memory that stores program code that is executable by the processing circuit relating to depletion processing safety measures. With such a configuration, the processing circuit can couple with the memory to read and execute depletion processing safety measures in response to the generation of the output signal of the monitoring circuit.

In another embodiment of the present invention, a battery powered device also has one or more receptacles for receiving cards. The device also comprises a monitoring circuit coupled to a power supply that generates an output signal indicative of an onset of a depletion of the battery power generated by the power supply. A power control circuit is provided which only attempts to prevent the power supply from delivery battery power to the one or more receptacles in response to the generation of the output signal of the monitoring circuit. A processing circuit of the battery powered device receives battery power without interference from the power control circuit even after the generation of the output signal of the monitoring circuit. The device further comprises a memory that stores program code that is executable by the processing circuit relating to depletion processing safety measures. The processing circuit couples with the memory to read and execute depletion processing safety measures in response to the generation of the output signal of the monitoring circuit.

Additionally, in all embodiment described herein the receptacles could, of course, comprise PCMCIA card slots, although many other types of receptacles and corresponding cards might be used.

Many other aspects of the present invention will be appreciated with full reference to the specification, drawings and claims.

DETAILED DESCRIPTION OF THE INVENTION

Figure 1:
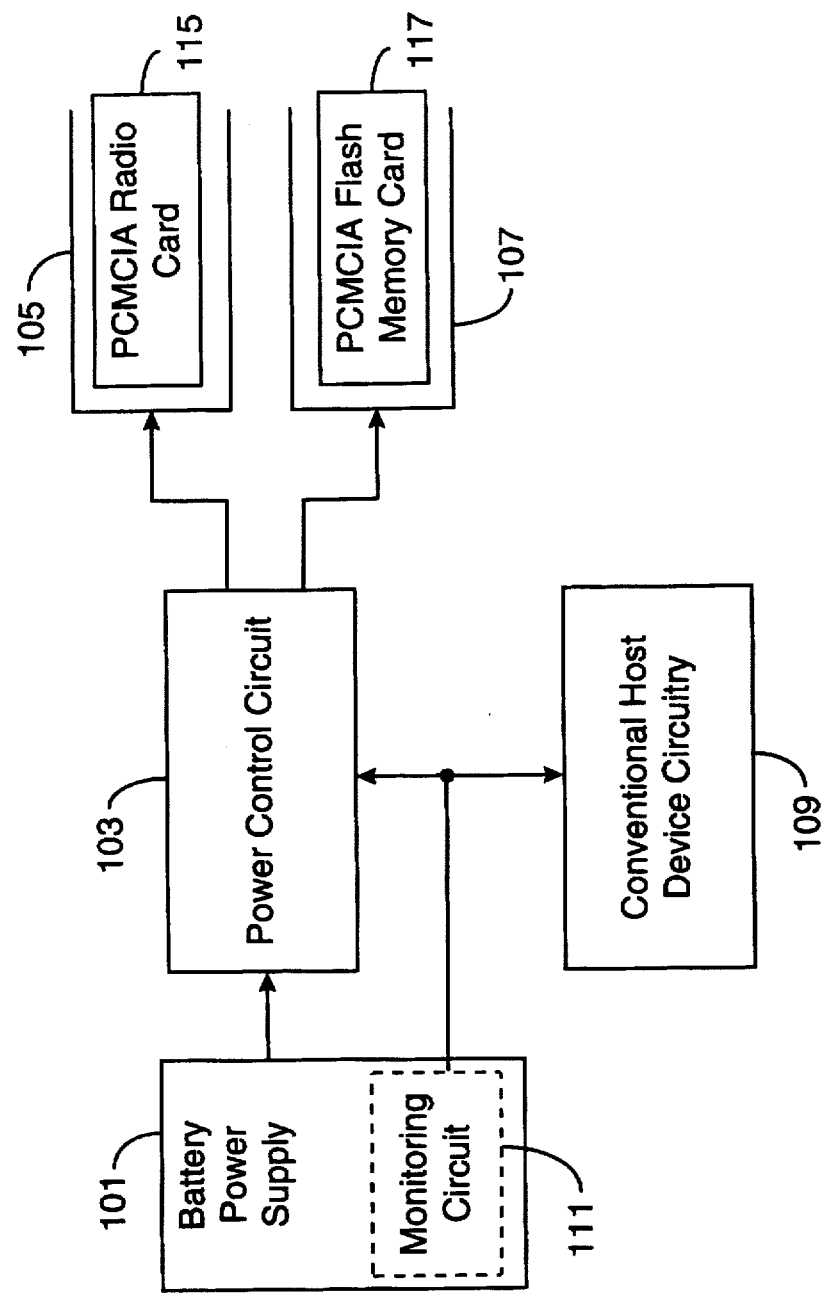
FIG. 1 is a block diagram illustrating the functionality of one embodiment of a portable computing device built in accordance with the present invention, and comprising power delivery control circuitry that removes power from installed PCMCIA cards upon detecting the onset of battery power depletion.

FIG. 1 is a block diagram illustrating the functionality of one embodiment of a portable computing device built in accordance with the present invention, and comprising power delivery control circuitry that removes power from installed PCMCIA cards upon detecting the onset of battery power depletion. In particular, a portable computing device or host device of the present invention comprises a battery power supply 101, a power control circuit 103, two PCMCIA slots 105 and 107, and various conventional host device circuitry 109. The conventional host device circuitry 109 might involve, for example, a processor, memory, user interface drivers, etc., as is well known in the art.

As illustrated, the two PCMCIA slots 105 and 107 contain PCMCIA radio card 115 and a PCMCIA flash memory card 117, although other combinations and types of PCMCIA cards and additional slots might be used. Under normal operating conditions, the battery power supply 101 delivers power to the PCMCIA cards 111 and 113 via the power control circuitry. However, whenever an onset of battery depletion is detected, the power control circuit interrupts the deliver of power, causing the power down of the PCMCIA cards 115 and 117. With such interruption, the load caused by the PCMCIA cards 115 and 117 is removed from the battery power supply 101, extending battery resources to allow the host device a known and sufficiently designed time period for successfully carrying out onset procedures. In other words, because the unknown loading caused by the PCMCIA cards 115 and 117 is removed at the instant of onset detection, the remaining, known loading caused by the host terminal can be used as a design criterion when setting onset detection thresholds to ensure sufficient onset processing time periods.

More specifically, the battery power supply 101 contains a battery monitoring circuit 111 which detects the onset of battery depletion by monitoring, for example, the voltage level of the battery through a comparison with an onset threshold. Details of such monitoring are well known in the art. Upon detecting an onset, the battery monitoring circuit 111 delivers an onset signal to the power control circuit 103 and to the host device circuitry 109. In response, the power control circuit 103 interrupts the delivery of battery power to the PCMCIA cards 115 and 117, freeing the battery power supply 101 from such loading. Also in response to the delivery of the onset signal, the host device circuitry 109 responds by attempting to gain the users attention so that the user can respond by saving, powering down, and/or supplementing, replacing or recharging battery resources before battery depletion actually occurs. Thereafter, upon reestablishing sufficient battery resources, the monitoring circuit 111 removes the onset signal, and the power control circuit 103 reestablishes the flow of battery power to the PCMCIA cards 105 and 107.

Furthermore, by immediately disabling the PCMCIA cards 115 and 117 upon detection of depletion onset, the PCMCIA cards 115 and 117 are relieved of all opportunities to begin or continue tasks that cannot be finished. They are also relieved of all opportunities to begin or continue tasks that should not take precedence over onset procedures. An underlying assumption with this configuration is that managing remaining battery power upon onset detection involves disabling PCMCIA cards first, because, per design constraints, the host device should be able to safely operate without PCMCIA card functionality to carry out onset procedures.

Figure 2:
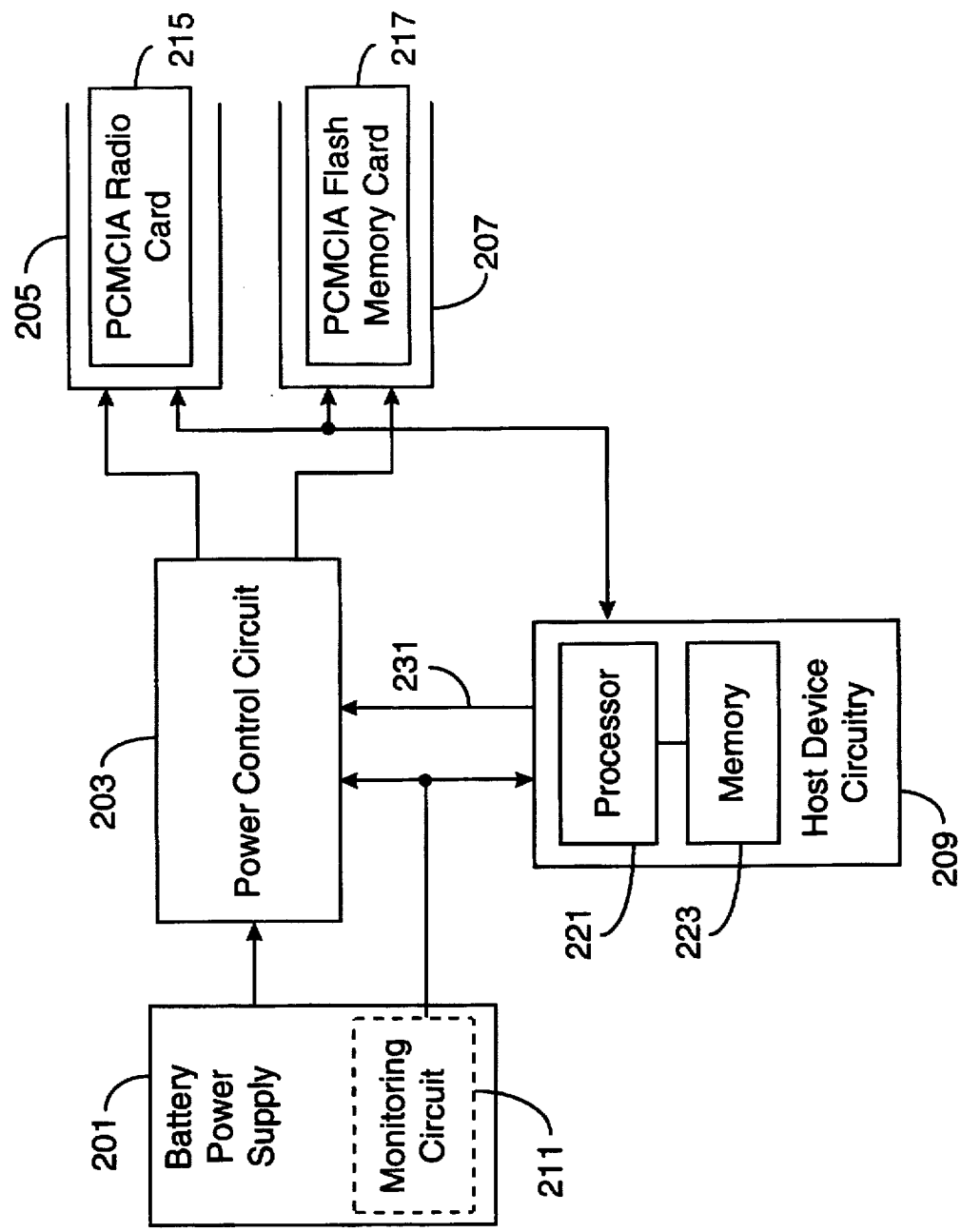
FIG. 2 is a block diagram illustrating the functionality of another embodiment of the portable computing device of FIG. 1 wherein the portable computing device selectively overrides the power deliver control circuitry based on the type of PCMCIA card installed.

FIG. 2 is a block diagram illustrating the functionality of a further embodiment of the portable computing device of FIG. 1 wherein the portable computing device selectively overrides the power deliver control circuitry based on the type of PCMCIA card installed. In particular, the portable computing or host device comprises a battery power supply 201, a power control circuit 203, two PCMCIA slots 205 and 207, and host device circuitry 209. The PCMCIA slots 205 and 207, as illustrated, contain exemplary PCMCIA cards, i.e., a PCMCIA radio card 215 and a PCMCIA flash memory card 217.

In addition to other conventional circuitry, the host device circuitry 209 comprises a processor 221 and associated memory 223. The associated memory 223 stores code which programmatically defines the operation of the processor 221 relating to the delivery of power to the PCMCIA card slots 205 and 207 after onset detection. Pursuant to such operation, the processor 221 will prevent the power control circuitry 203 from interrupting power delivery to a PCMCIA card slot wherein an inserted PCMCIA card justifies the detrimental loading effect on the onset procedures. For example, if an installed PCMCIA card draws very little power even during peak conditions, removing power therefrom may not prove justifiable. Similarly, a PCMCIA card which might suffer from data loss or damage might not justify power interruption.

Specifically, based on the justification for leaving a given PCMCIA card powered up after onset detection, the processor 221 delivers enable or disable signals via a bus 231 to the power control circuit 203. In response, the ability of the power control circuit 203 to interrupt power delivery to the PCMCIA card slots 205 and 207 is correspondingly enabled or disabled. For example, as illustrated, the processor 221 may choose to prevent the power control circuit 203 from interrupting power from the PCMCIA card 217 (preventing data storage corruption), while permitting the power control circuit 203 to interrupt the power to the PCMCIA card 215 which draws relatively high power.

Thus, the host device provides power to the PCMCIA cards 215 and 217 so long as a monitoring circuit 211 does not detect battery depletion onset, and, upon detection of onset, the monitoring circuit 211 delivers an onset signal to both the power control circuit 203 and the host device circuitry 209. The host device circuitry 209 responds as before by initiating the onset procedures. Similarly, as before, the power control circuit 203 interrupts power to the PCMCIA radio card 215. However, because it has been disabled by the processor 221 regarding the PCMCIA slot 207, the power control circuit 203 does not interrupt power to the PCMCIA flash memory card 217. Therefore, after onset, the processor 221 may continue storage and retrieval operations with the PCMCIA flash memory card 217, or decide to store data and operating parameters therein before powering down.

Of course alternate embodiments are contemplated, such as where the monitoring circuit 211 only delivers the onset signal to the processor 221, and, in turn, the processor 221 selectively forwards the onset signal to the power control circuit 203 if power interruption is desired. Similarly, a separate control circuit might be used for providing the functionality described above attributed to the processor 221. However, such and many other modifications might be made by one of ordinary skill in the art while accomplishing the desired teachings disclosed in the merely illustrative examples shown in this and other figures.

Figure 3:
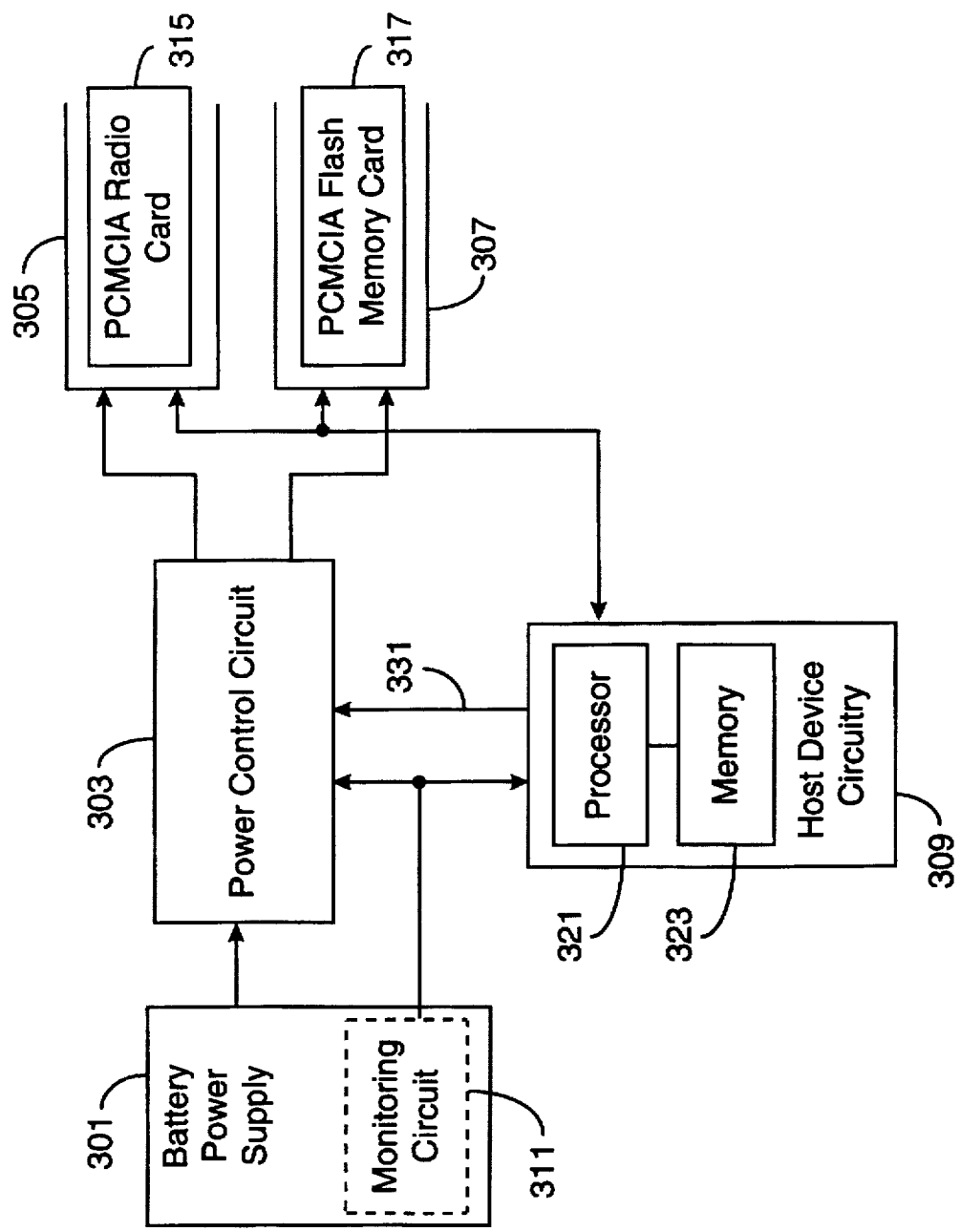
FIG. 3 is a block diagram illustrating additional functionality that is added in some configurations of the portable computing device of FIG. 2 in accordance with another aspect of the present invention.

FIG. 3 is a block diagram illustrating functionality that is added in some configurations of the portable computing device of FIG. 2 in accordance with a further aspect of the present invention. Again, the portable computing device or host device comprises a battery power supply 301, a power control circuit 303, two PCMCIA slots 305 and 307, and host device circuitry 309. The PCMCIA slots 305 and 307, as illustrated, contain exemplary PCMCIA cards, i.e., a PCMCIA radio card 315 and a PCMCIA flash memory card 317. In addition to other conventional circuitry, the host device circuitry 309 comprises a processor 321 and associated memory 323.

As with the memory 223 (FIG. 2), the associated memory 323 stores code which programmatically defines the operation of the processor 321 relating to the delivery of power to the PCMCIA card slots 305 and 307 after onset detection. Pursuant to such operation, the processor 221 will prevent the power control circuitry 203 from interrupting power delivery to a PCMCIA card slot wherein an inserted PCMCIA card justifies the detrimental loading effect on the onset procedures. However, unlike the operation described in FIG. 3, the processor 321 may also choose to temporarily enable and/or disable power interruption via the power control circuit 303 after an onset signal has been received.

For example, while operating normally with sufficient battery resources, the processor 321 may choose to disable the power control circuit 303 as it applies to the PCMCIA flash memory card 317, and enable the power control circuit 303 as it applies to the PCMCIA radio card 315. Thus, upon delivery of the onset signal by the monitoring circuit 311, the power control circuit 303 responds by only interrupting the power to the PCMCIA radio card 315. The PCMCIA flash memory card 317 continues to operate. Thereafter, upon determining that the PCMCIA flash memory card 317 is idle (or whenever it becomes idle), the processor 321 delivers an enable signal via a bus 331, safely enabling the interruption of power to the PCMCIA flash memory card 317. Similarly, after sufficient onset processing has been carried out, while still in the onset state, the processor 321 may choose to send a disable signal to the power control circuit 303 regarding the PCMCIA radio card 315. In response, the power control circuit 303 will disable interruption of power to the PCMCIA radio card 315, permitting, for example, the processor 321 to send or receive critical information with the remaining power resources. Alternatively, instead of immediate power down after onset, the PCMCIA radio card 315 might be permitted to complete an ongoing transmission or reception before power is finally interrupted.

Figure 4:
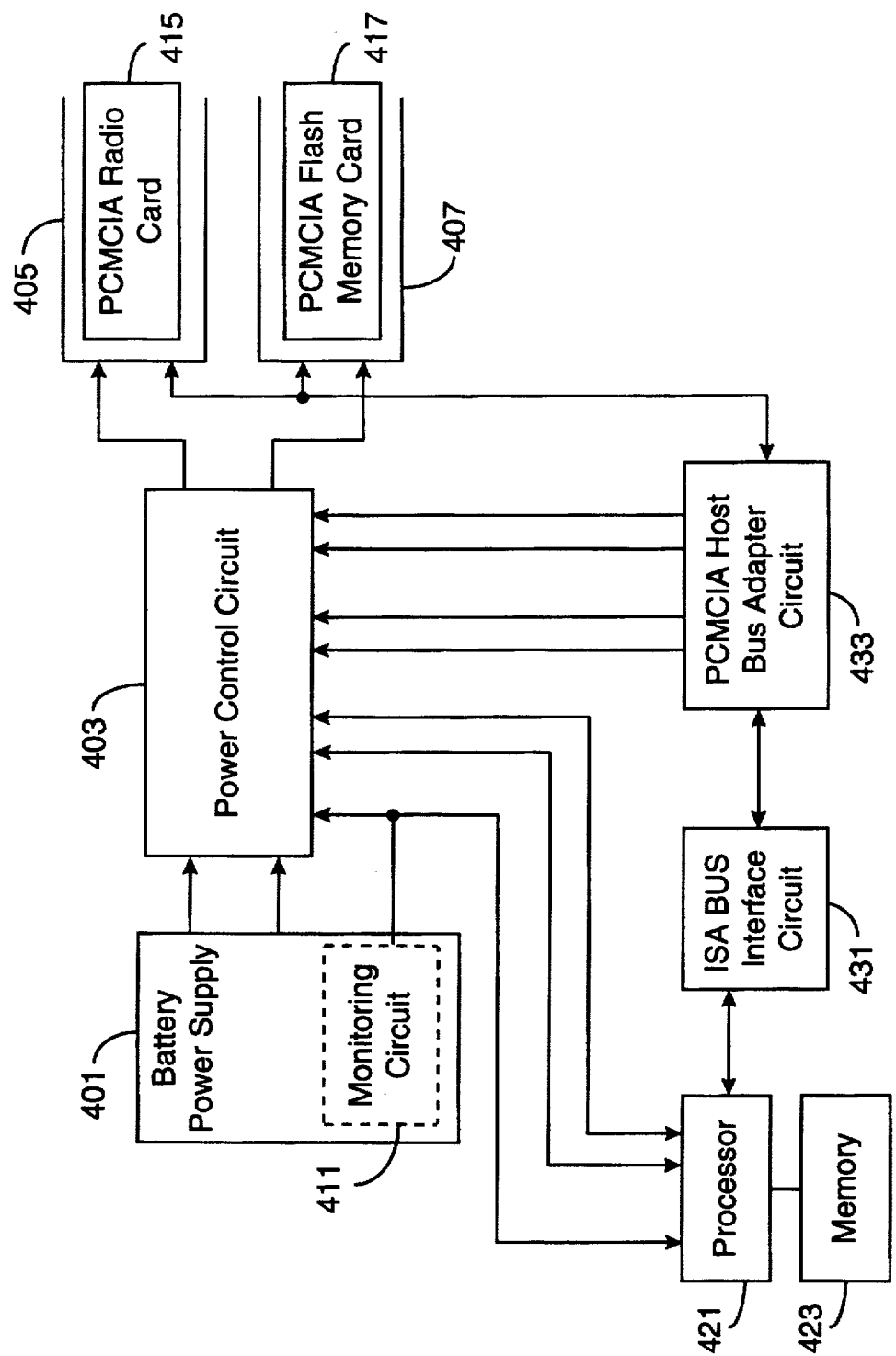
FIG. 4 is a block diagram illustrating an exemplary implementation of the portable computing devices of FIGS. 2 and 3.

From FIGS. 3 and 4, it should be clear that the processor 321 (or any substitute control circuitry) may interact closely with the power control circuitry 303 to selectively override (permanently or temporality) any one or more PCMCIA cards which happen to be inserted within the portable computing device. The specific selective interaction chosen can be configured upon installation of a PCMCIA card into the portable computing device, preconfigured for specific types of PCMCIA cards, and/or defined through user interaction after onset detection. An exemplary illustration might constitute the user's interaction with the portable terminal device (after being warned of onset) to override the power control circuit 303 via the processor 321 to power up the PCMCIA radio card 315 for an emergency use with remaining battery power resources.

FIG. 4 is a block diagram illustrating an exemplary implementation of the portable computing devices of FIGS.

2 and 3. Specifically, the host device comprises a battery power supply 401 (having a monitoring circuit 411), a power control circuit 403, two PCMCIA slots 405 and 407, a processor 421, a memory 423, ISA (Industry Standard Architecture) bus interface circuitry 431 and PCMCIA host bus adapter circuitry 433. The operation and functionality of the illustrated components correspond to that described above in reference to corresponding components in FIGS. 2 and 3, with a few minor details. For example, further details are provided regarding the mechanism in which the processor 421 communicates with the PCMCIA cards 415 and 417 and the power control circuit 403. Particularly, the ISA bus circuitry 431, found in many conventional computing devices, is used by the PCMCIA adapter circuitry 433 to communicate couple the PCMCIA cards 415 and 417 with the processor 421.

Figure 5A:
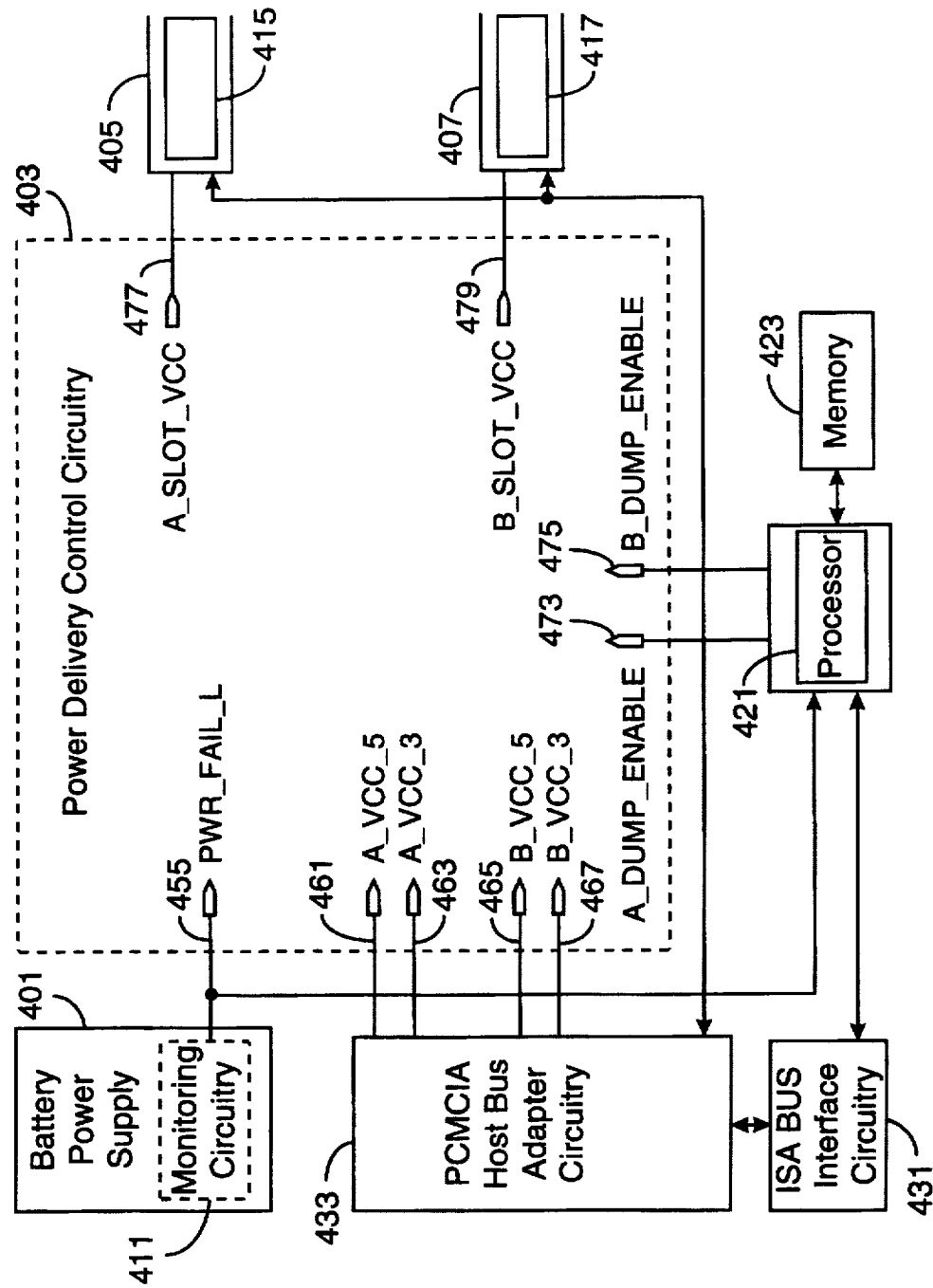
FIGS. 5a and 5b are a block diagrams that provide a more detailed illustration of the underlying implementation of the portable computing devices of FIG. 4.
Figure 5B:
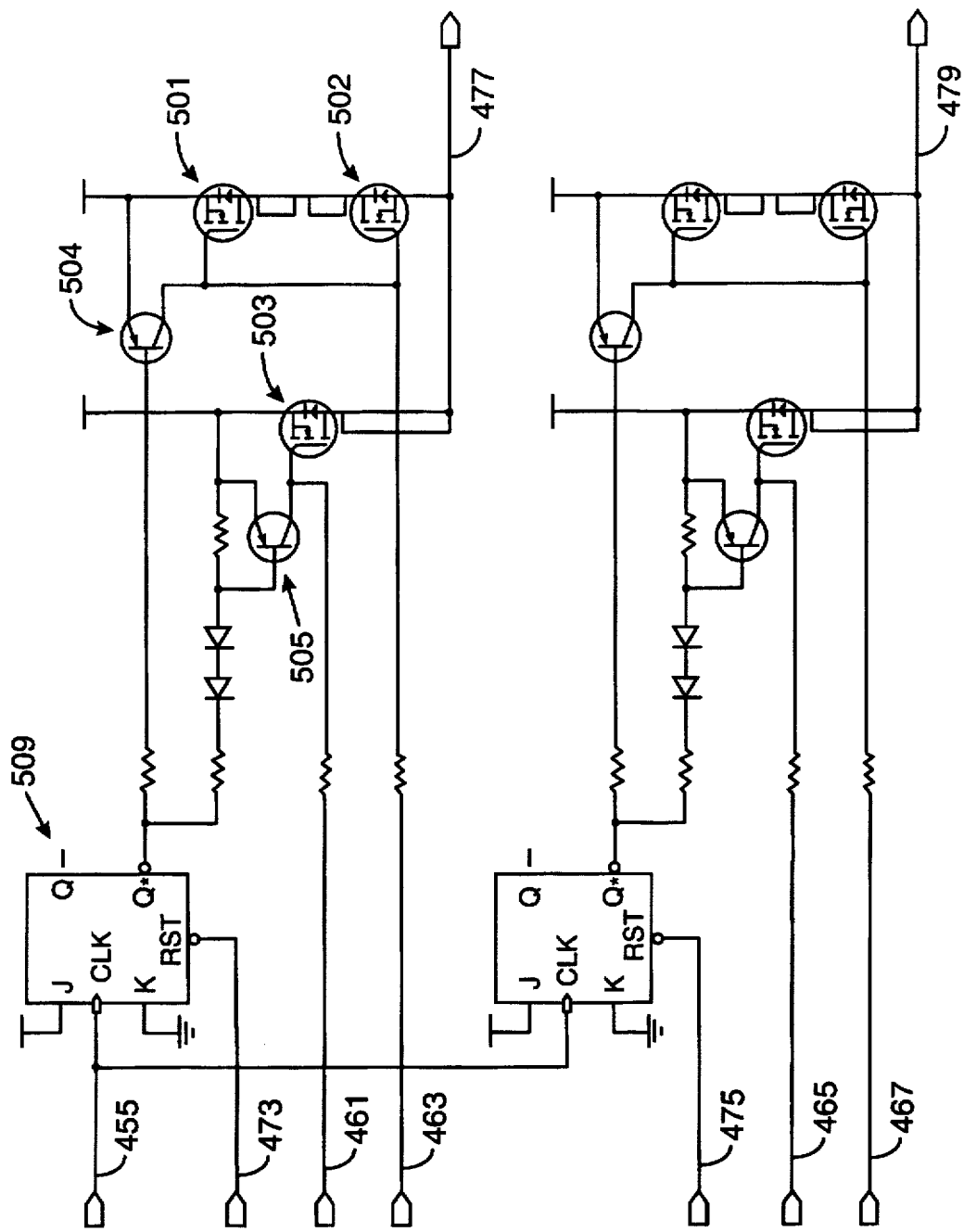

FIGS. 5a and 5b are a block diagrams that provide a more detailed illustration of the underlying implementation of the portable computing devices of FIG. 4. Referring to FIG. 5a, the battery power supply 401 delivers two voltage levels, 5.0 and 3.3 Volts—via lines 451 and 453 respectively, for potential PCMCIA card power. The PCMCIA host bus adapter circuitry 433 selectively delivers either a supply enable signal on either a line 461 (labeled A_VCC_5) or a line 463 (labeled A_VCC_3) to correspondingly select either 5.0 or 3.3 volt power delivery at the PCMCIA slot 405 (FIG. 5a) via a line 477. Similarly, the PCMCIA host bus adapter circuitry 433 selectively delivers a supply enable signal on either a line 465 (labeled A_VCC_5) or a line 467 (labeled A_VCC_3) to select either 5.0 or 3.3 volt power delivery at the PCMCIA slot 407 via a line 479. Such selectivity is typically controlled by system software. The PCMCIA host bus adapter circuitry 433 also provides an interface with the PCMCIA slots 405 and 407 via a bus 471.

The monitoring circuit 411 delivers an onset detect signal along a line 455 (labeled PWR_FAIL_L) to the power control circuit 403. The onset detect signal is also delivered to the processor 421. The processor 421 (via conventional control logic, e.g., via address decode circuitry, etc.) selectively delivers enable signals along lines 473 and 475 corresponding respectively to the PCMCIA slots 405 and 407. The PCMCIA slots 405 and 407 receive power (unless interrupted) via respective lines 477 and 479.

During normal operation when sufficient power resources are available, the power control circuit 403 delivers either 5.0 or 3.3 volts to both the PCMCIA slots 405 and 407 via the lines 477 and 479, respectively. During this time, the processor 421 selectively delivers disable/enable signals via the lines 473 and 475 to respectively disable or enable the corresponding power interruption functionality performed upon and after onset by the power control circuit 403. Details regarding such selectivity can be found above and need not be repeated.

FIG. 5b is an exemplary schematic diagram illustrating one possible implementation for carrying out the aforementioned functionality of the power control circuit 403. Because the circuitry associated with the PCMCIA slot 407 via the line 479 (i.e., the lower half of the FIG. 5b) is identical to that associated with the PCMCIA slot 405 via the line 477, only the later will be described in detail. In particular, transistor switches 501, 502 and 503 are typical power switches that may be used to select either 3.3 or 5.0 volts to be applied to the PCMCIA slot 405 via the line 477. These switches are controlled by the PCMCIA host bus adapter 433 (FIG. 5a) which interfaces to the computer system bus, i.e., the ISA bus. Pursuant to system software stored in the memory 423 (FIG. 5a), the processor 421 acting via the ISA bus circuitry 431 and the PCMCIA bus adapter circuitry 433 determines the appropriate operating voltage for the particular PCMCIA device and delivers the appropriate enable signal via either the line 461 or 463.

When activated, transistors 504 and 505 cause power interruption to the PCMCIA slot 405 (FIG. 5a) via the line 477 by removing the gate drive voltage from the switch transistors 501, 502 and 503. The transistors 504 and 505 are activated when a flip-flop 509 is set (such that its QN output enters a logic low state), causing the interruption of power. Otherwise (while the flip-flop 509 is reset), power freely flows along the line 477 the PCMCIA slot 405.

The enable line 473 entitled "A_DUMP_ENABLE" performs two functions. If the line 473 is held low (i.e., the processor delivers a disable signal to the line 473 indicating a desire to disable the power interrupt functionality), the flip-flop 509 is forced reset regardless of the state of the onset signal on the line 455. While reset, the QN output of the flip-flop 509 is held in a high logic state, the transistors 504 and 505 will be off, and battery power will be delivered via the line 477. However, if the line 473 is held high (i.e., indicating a desire to enable the power interrupt functionality), the flip-flop 509 is armed and awaits clocking via the onset signal along the line 455. When battery depletion onset is detected, the monitoring circuit 411 (FIG. 5a) transitions the logic level of the line 455 from a high to a low level, clocking the QN output low. As a result, the transistors 505 and 504 are activated, causing interruption of power to the PCMCIA slot 405 (FIG. 5a) via the line 477.

Upon interrupting the delivery of power, the condition persists until the flip-flop 509 is reset by cycling the line 473 low and back to a high logic state. This persistence prevents oscillations between powering up and down which might otherwise occur due to misinterpretation by the monitoring circuit 411 of the increased battery voltage caused when the PCMCIA card 405 (FIG. 5a) load is removed.

Further modifications can also be made to the host devices described in reference to FIGS. 2–4. For example, the host processor can be configured to identifies peak and average power information regarding each inserted PCMCIA card. From such information along with detailed data regarding both typical host device loading (without the PCMCIA cards) and remaining battery power resources upon onset detection, the host processor can make more appropriate decisions as to when and/or whether to permit power interruption to a given installed PCMCIA card. Such information regarding peak and average power can be looked up in a predefined table, provided upon installation of the PCMCIA card, or identified by monitoring the loading characteristics of an installed PCMCIA card over time. The data regarding remaining battery power resources and typical host device loading can be set as factory default data else could be extracted via actual load monitoring over time. With such information, the host processor should be able to make fairly accurate estimations regarding the available loading per onset processing unit of time. With such estimates, safer decisions regarding post onset powering of PCMCIA cards may be made.

Although the features of the present invention were illustrated with reference to portable computing devices, such features have equal applicability with other types of devices. For example, devices which are not portable but battery powered would benefit from the teachings herein. Similarly, even non-battery powered devices such as those powered by UPS (Uninterruptable Power Supply) systems would benefit when reserve power is being used. Further, the term "computing device" as used herein is not meant to be limited only to computers, but, instead, is meant to cover such devices as peripherals, appliances or any other device which utilizes PCMCIA cards. Likewise, although PCMCIA type cards and slots have particular characteristics which significantly benefit from the aforementioned aspects of the present invention, various other types of cards and receptacles or slots which now exist or which may be created, e.g., as a future standard, could equally benefit from these teachings.

As is evident from the description that is provided above, the implementation of the present invention can vary greatly depending upon the desired goal of the user. For example, depending on the desired implementation, the functionality attributed to the processor 421 might alternately be carried out by independent control circuitry having a dedicated microprocessor. Moreover, the scope of the present invention is intended to cover all variations and substitutions which are and which may become apparent from the illustrative embodiments of the present invention that is provided above, and the scope of the invention should be extended to the claimed invention and its equivalents. Finally, it is to be understood that many variations and modifications may be effected without departing from the scope of the present disclosure.

We claim:

1. A battery powered device having one or more receptacles for receiving cards, the battery powered device comprising:

a power supply that generates battery power;

a monitoring circuit coupled to the power supply that generates an output signal indicative of an onset of a depletion of the battery power;

a power control circuit that only attempts to prevent the power supply from delivery battery power to the one or more receptacles in response to the generation of the output signal of the monitoring circuit;

a processing circuit that receives battery power without interference from the power control circuit even after the generation of the output signal of the monitoring circuit;

a memory that stores program code that is executable by the processing circuit relating to depletion processing safety measures; and the processing circuit couples with the memory to read and execute depletion processing safety measures in response to the generation of the output signal of the monitoring circuit.

2. The battery powered device of claim 1 wherein the processing circuit selectively overrides the power control circuit in the attempt to prevent the power supply from delivering battery power to the one or more receptacles.

3. The battery powered device of claim 2 wherein the processing circuit makes decisions to override the power control circuit based on characteristics of a card inserted within the receptacle.

4. The battery powered device of claim 2 wherein the one or more receptacles comprises one or more PCMCIA card slots.

5. The battery powered device of claim 2 wherein the processing circuit selectively overrides the power control circuit after permitting the processing circuit to temporarily prevent the delivery of battery power to the one or more receptacles.

6. The battery powered device of claim 1 utilized by a user, wherein the depletion processing safety measures comprises attempting to alert the user.

7. The battery powered device of claim 6 wherein the depletion processing safety measures further comprises attempting to save operational information for later recovery.

8. The battery powered device of claim 7 wherein the one or more receptacles comprises one or more PCMCIA card slots.

9. A battery powered device having one or more receptacles for receiving cards, the battery powered device comprising:

a power supply that generates battery power;

a monitoring circuit coupled to the power supply that generates an output signal indicative of an onset of a depletion of the battery power;

a power control circuit that attempts to prevent the power supply from delivery battery power to the one or more receptacles in response to the generation of the output signal of the monitoring circuit;

a processing circuit that receives battery power without interference from the power control circuit even after the generation of the output signal of the monitoring circuit; and the processing circuit selectively overrides the power control circuit in the attempt to prevent the power supply from delivering battery power to the one or more receptacles.

10. The battery powered device of claim 9 utilized by a user, wherein the processing circuit attempts to alert the user in response to the generation of the output signal of the monitoring circuit.

11. The battery powered device of claim 10 wherein the processing circuit attempts to save operational information for later recovery.

12. The battery powered device of claim 9 wherein the one or more receptacles comprises one or more PCMCIA card slots.

13. The battery powered device of claim 9 further comprising:

a memory that stores program code that is executable by the processing circuit relating to depletion processing safety measures; and the processing circuit couples with the memory to read and execute depletion processing safety measures in response to the generation of the output signal of the monitoring circuit.

* * * * *